(12) United States Patent
Cobb et al.

(10) Patent No.: US 7,732,102 B2
(45) Date of Patent: Jun. 8, 2010

(54) CR-CAPPED CHROMELESS PHASE LITHOGRAPHY

(75) Inventors: Jonathan L. Cobb, Austin, TX (US); Bernard J. Roman, Austin, TX (US); Wei E. Wu, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 968 days.

(21) Appl. No.: 11/181,169

(22) Filed: Jul. 14, 2005

(65) Prior Publication Data

US 2007/0015064 A1    Jan. 18, 2007

(51) Int. Cl.
*G03F 1/00*    (2006.01)
(52) U.S. Cl. ............................. 430/5; 430/311
(58) Field of Classification Search ............ 430/5, 430/30, 311–313
See application file for complete search history.

(56) References Cited

U.S. PATENT DOCUMENTS

| | | | |
|---|---|---|---|
| 2003/0064298 A1* | 4/2003 | Broeke et al. | 430/5 |
| 2004/0010770 A1 | 1/2004 | Broeke et al. | 716/21 |
| 2004/0063000 A1 | 4/2004 | Maurer et al. | 430/5 |
| 2004/0063002 A1* | 4/2004 | Wu et al. | 430/5 |
| 2004/0115539 A1* | 6/2004 | Broeke et al. | 430/5 |
| 2004/0197671 A1* | 10/2004 | Lin et al. | 430/5 |

OTHER PUBLICATIONS

Hsu, Stephen D. et al.; "RET Integration of CPL™ Technology for Random Logic"; Study for ASML Mask Tools, Santa Clara, CA, and Motorola; 18 pages.

* cited by examiner

*Primary Examiner*—Mark F Huff
*Assistant Examiner*—Stewart A Fraser
(74) *Attorney, Agent, or Firm*—John A. Fortkort; Fortkort & Houston P.C.

(57) ABSTRACT

A photolithographic mask is adapted for use in imparting a pattern to a substrate. The pattern comprises a plurality of features. At least one of the plurality of features (201) is implemented in the mask as a phase shifting structure (205) with a unitary layer of opaque material (207) disposed thereon. The mask is utilized to impart the pattern to a layer over a semiconductor substrate.

15 Claims, 4 Drawing Sheets

CR-CAPPED CHROMELESS PHASE LITHOGRAPHY

FIELD OF THE DISCLOSURE

The present disclosure relates generally to chromeless phase lithography (CPL), and more particularly to methods for making photomasks useful in CPL applications.

BACKGROUND OF THE DISCLOSURE

As a result of innovations in integrated circuit and packaging fabrication processes, dramatic performance improvements and cost reductions have been obtained in the electronics industry. The speed and performance of chips, and hence the computer systems that utilize them, are ultimately dictated by the minimum printable feature sizes obtainable through lithography. The lithographic process, which replicates patterns rapidly from one wafer or substrate to another, also determines the throughput and the cost of electronic systems. A typical lithographic system includes exposure tools, masks, resist, and all of the processing steps required to transfer a pattern from a mask to a resist, and then to devices.

Chromeless phase lithography (CPL) is a particular lithographic technique that utilizes chromeless mask features to define circuit features with pairs of 0-degree and 180-degree phase steps. These phase steps can be obtained, for example, by etching a trench in a quartz substrate to a depth corresponding to a 180-degree phase shift at the illumination wavelength of the lithography system. Alternatively, phase shift layers can be formed as mesas on a quartz substrate.

CPL mask designs can be created by assigning circuit features to different zones or groups, based on the physical attributes of those features. One example of such a system, which is known to the art, is depicted in FIGS. 1-2. The system illustrated therein utilizes three such zones. The boundaries of each zone are defined herein for illustrative purposes only. In the system of FIGS. 1-2, circuit features having widths of 90 nm or less are assigned to Zone 1. These features are constructed with 100% transmission phase-shifted structures and are printed utilizing adjacent phase edges. Hence, these features are chromeless features. Features having a width greater than 130 nm are deemed to reside in Zone 3, and are printed utilizing chrome features. Features having widths between 90 nm and 130 nm are deemed to reside in Zone 2. The features of Zone 2 are too wide to be defined using the 100% transmission of pure CPL and may be too narrow to be printed solely in chrome, and hence are printed using a so-called 'zebra' pattern treatment. The zebra pattern treatment employs a plurality of sub-resolution chrome patches which are formed on the chromeless feature pattern to be imaged and which are intended to reduce the average optical transmission of the otherwise chromeless feature. If correctly defined on the mask, the zebra pattern treatment can result in improved lithographic margins for features that reside in Zone 2 compared to either chromeless or chrome features.

While CPL processes of the type depicted in FIGS. 1-2 have some desirable attributes, the zebra pattern utilized in these processes contains structures that are sub-resolution. Moreover, the zebra structures are secondary features formed in a second writing step which typically involves use of an optical pattern generator (the first writing step being an electron beam pattern generator used to form the primary, chromeless features). Hence, the sub-resolution features in the zebra structure may not be formed using a high resolution pattern generator and must also be registered with the primary, chromeless features. Consequently, the mask utilized to take advantage of these structures is difficult to fabricate, inspect and repair. The zebra structures also significantly increase the size of the pre- and post-fracture database, hence making fabrication of the mask a computationally intensive undertaking. Moreover, in practice, critical dimension (CD) uniformity and control on zebra structures has proven to be less than desirable.

There is thus a need in the art for a CPL mask design that overcomes the aforementioned infirmities. In particular, there is a need in the art for a method for simplifying the fabrication of CPL masks, particularly for Zone 2 features. These and other needs are met by the devices and methodologies described herein.

DETAILED DESCRIPTION

Figure 1:
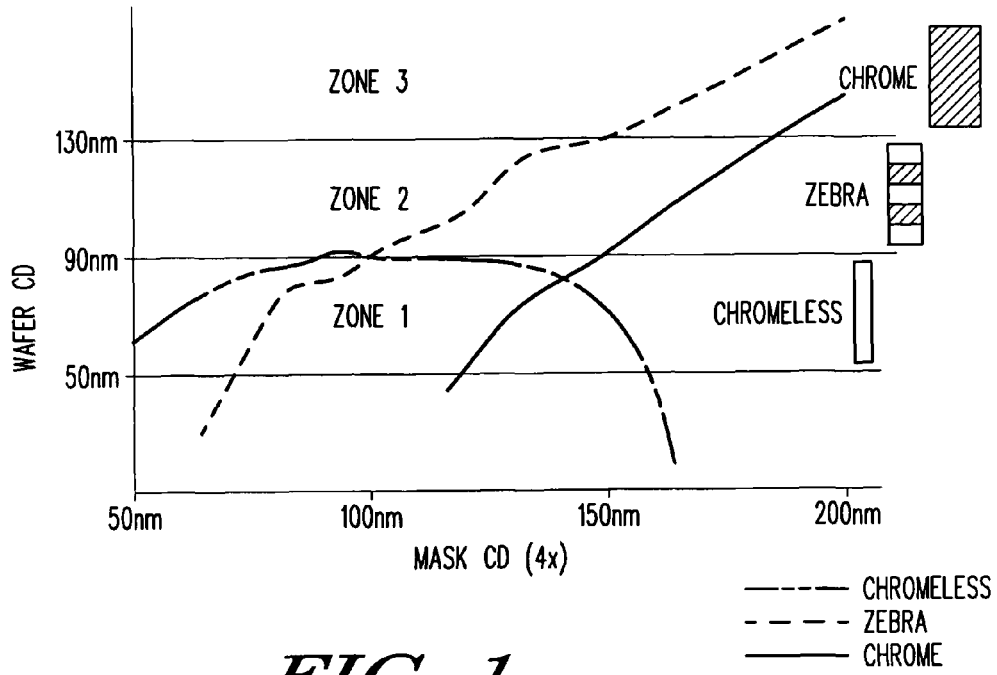
FIG. 1 is a graph of wafer critical dimensions as a function of mask critical dimensions for a prior art CPL process.

In one aspect, a method for imparting a pattern to a substrate is provided. In accordance with the method, a photolithographic mask is provided which is adapted for use in imparting a pattern to a substrate, wherein the pattern comprises a plurality of features, and wherein at least one of the plurality of features is implemented in the mask as a phase shifting structure with a unitary layer of opaque material disposed thereon. The opaque material may be, for example, chrome. The mask is then utilized to impart the pattern to a substrate.

In another aspect, a method for imparting a pattern to a substrate is provided. In accordance with the method, a photolithographic mask is provided which is adapted for use in imparting a pattern to a substrate. The pattern comprises a plurality of features, and the photolithographic mask comprises (a) a first set of mask features adapted to produce pattern features having a critical dimension CD within the range of 0<k≦CD<m, where k and m are real numbers, wherein the first set of mask features includes a plurality of phase shifting structures, and wherein each of the phase shifting structures has a unitary layer of opaque material disposed thereon, (b) a second set of mask features adapted to produce pattern features having a critical dimension CD<k, and (c) a third set of mask features adapted to produce pattern features having a critical dimension CD≧m. The mask is utilized to impart the pattern to a layer of photoresist disposed on a semiconductor substrate.

In another aspect, a photolithographic mask is provided which comprises a mask feature including a phase shifting structure with a unitary layer of opaque material disposed thereon.

In still another aspect, a photolithographic mask is provided which comprises (a) a first set of mask features adapted to produce device features having a critical dimension (CD), wherein 0<CD<k; (b) a second set of mask features adapted to produce device features having a critical dimension within the range of k<CD<m; and (c) a third set of mask features adapted to produce device features having a critical dimension CD≧m; wherein k and m are real numbers, and wherein the second set of mask features includes a phase shifting structure with a unitary layer of opaque material disposed thereon.

In yet another aspect, a phase-shift mask for producing a pattern in an optical resist disposed on a substrate is provided. The mask comprises a transparent substrate having a plurality of mesas thereon, each of said mesas being capped with a unitary layer of an absorbing material, wherein the absorbing material permits the passage of a portion of incident radiation with a phase shift θ>0 with respect to radiation incident on said substrate.

In a further aspect, a method for making a lithographic mask is provided. In accordance with the method, a pattern to be printed is provided, the pattern comprising a plurality of features, and at least one of the plurality of features is implemented in a lithographic mask as a phase shifting structure with a unitary layer of opaque material disposed thereon.

In still another aspect, a method for making photolithographic masks is provided. In accordance with the method, data is obtained which represents a pattern comprising a plurality of features having varying critical dimensions. A plurality of distinct zones are defined based on the critical dimensions of said plurality of features, the plurality of zones comprising (a) a first zone in which features having a critical dimension less than or equal to a first predetermined amount can be imaged utilizing chromeless phase lithography techniques, (b) a second zone in which features having a critical dimension greater than said first predetermined amount and less than a second predetermined amount can be imaged utilizing a combination of chromeless phase lithography techniques and chrome, and (c) a third zone in which features having a critical dimensions greater than said second predetermined amount can be imaged utilizing chrome. Each of the features are then categorized into one of the plurality of distinct zones, wherein at least one of the features in the second zone is implemented in the mask as a phase shifting structure with a unitary layer of chrome disposed thereon.

In yet another aspect, a method of generating a photolithographic mask for use in printing a target pattern on a substrate is provided. In accordance with the method, a maximum width $w_m$ is determined of features to be imaged on the substrate utilizing only phase-structures formed in the mask. A first group of features contained in the target pattern is then identified, each of the first group having a maximum width of at least $w_1$, such that $w_1 \leq w_m$. A second group of features contained in the target pattern is also identified, each of the second group having a maximum width of at least $w_2$ such that $w_2 > w_m$. The first group of features is extracted from the target pattern, and a first group of phase-structures is formed in the mask corresponding to the first group of features. The second group of features is extracted from the target pattern, and a second group of structures is formed in the mask corresponding to the second group of features, the second group of structures comprising phase structures capped with a unitary layer of chrome.

These and other aspects of the present disclosure are described in greater detail below.

It has now been found that, by replacing the so-called zebra structures (that is, the mask features that are imaged using both sub-resolution chrome and chromeless processes) with unitary opaque (e.g., chrome) caps in chromeless phase lithography (CPL), this implementation of CPL may be greatly simplified. In particular, the use of such unitary caps allows the difficult fabrication steps of the zebra features to be bypassed, reduces the complexity of the lithographic process, and reduces the pre- and post-fracture database size (and hence the computational intensity of the mask fabrication process). In some cases, this approach also provides better critical dimension (CD) control.

Figure 3:
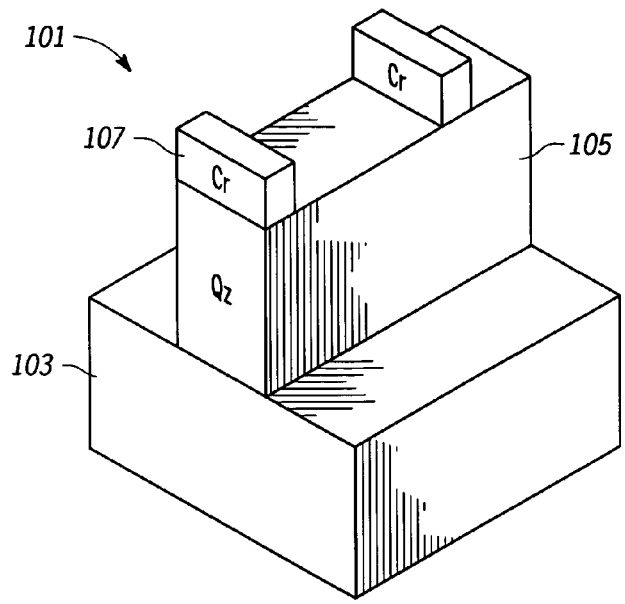
FIG. 3 is an illustration of a portion of a prior art CPL mask.
Figure 4:
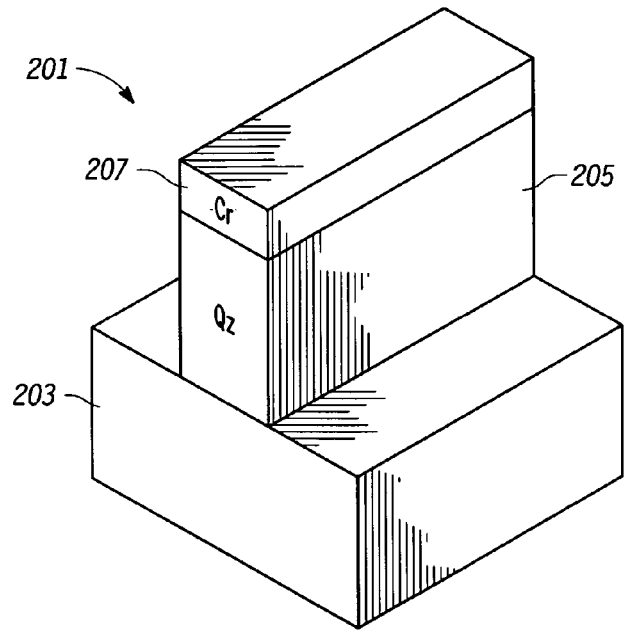
FIG. 4 is an illustration of a portion of a mask made in accordance with the teachings herein.

FIGS. 3-4 illustrate the difference between the zebra masking structures and the unitary capped structures used in the CPL process described herein. FIG. 3 illustrates a conventional zebra masking structure 101 for Zone 2 features. The masking structure 101 comprises a quartz substrate 103 upon which a plurality of mesas 105 have been defined (for simplicity of illustration, a single mesa 105 is depicted in the figure). A plurality of sub-resolution chrome patches 107 are formed on the horizontal surface of the mesa 105.

FIG. 4 illustrates a masking structure 201 made in accordance with the teachings herein which is designed as a replacement for the zebra masking structure. This masking structure contains a substrate 203 with a mesa 205 defined thereon. However, in contrast to the masking structure 101 of FIG. 3, the masking structure 201 of FIG. 4 contains a unitary layer of an opaque material 207 disposed on, and co-continuous with, the horizontal surface of the mesa 205. The opaque material 207 preferably comprises chrome. As previously noted, the use of a unitary layer of opaque material 207 greatly simplifies the fabrication of the masking structure 201.

In the particular embodiment illustrated in FIG. 4, the mesa 205 will preferably have a height of about 172 nm. This height is chosen to create a feature depth corresponding to a 180-degree phase shift at the illumination wavelength of the lithography system, which in this particular embodiment is 193 nm. It will thus be appreciated that a different height might be required if a different illumination wavelength is utilized, a phase shift other than 180-degree is desired, and/or if a material other than synthetic quartz is utilized for the substrate. Similarly, while the layer of opaque material 207 will preferably have a thickness of approximately 80 nm, it will be appreciated that other thicknesses may be used, depending, for example, on the desired opacity of the material, the design rules, and the exposure tools, masks, resists, and process parameters employed in the lithographic process.

The opaque material 207 may comprise various materials, including, for example, tungsten, titanium, tantalum, TaN, and Ni, that are substantially opaque to the actinic radiation. Preferably, the opaque material 207 is a material that is easily deposited and etched using commonly available commercial tools. It is also preferred that the opaque material 207 has the desired level of opacity at a thickness of less than 1000 Å. Most preferably, the opaque material 207 is chrome.

The phase shifting structures disclosed herein may be adapted to produce various phase shifts, with the desired magnitude of the phase shift depending, in part, on the end use. Often, the desired phase shift will be 180° ($\pi$ radians). More generally, however, the phase shift θ (in radians) is within the range of $0.57\pi \leq \theta \leq 1.5\pi$, preferably within the range of $0.75\pi \leq \theta \leq 1.25\pi$, and more preferably with the range of $0.9\pi \leq \theta \leq 1.1\pi$.

The substrate 203 in the masking structure of FIG. 4 is preferably synthetic quartz, due to the high transparency (essentially 100%), low cost, and thermal stability of this material. However, it will be appreciated that other materials having the appropriate physical and optical properties for a given application could also be used, including, but not limited to, certain specialty glasses.

Figure 5:
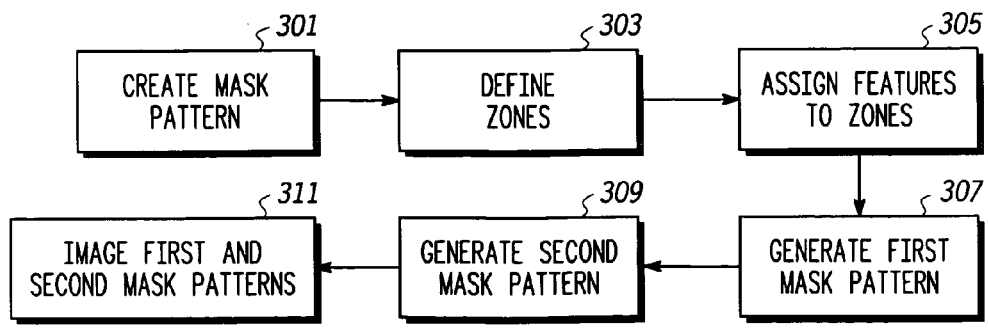
FIG. 5 is a flowchart which illustrates a process for fabricating a mask in accordance with the teachings herein.

The methodology disclosed herein may be appreciated with reference to the particular, non-limiting embodiment disclosed in FIG. 5. In the process shown therein, the desired mask pattern to be imaged on the wafer is obtained as shown in step 301. The mask pattern will typically be obtained in the form of mask data, which may be, for example, in GDS format or in another suitable data format.

Figure 2:
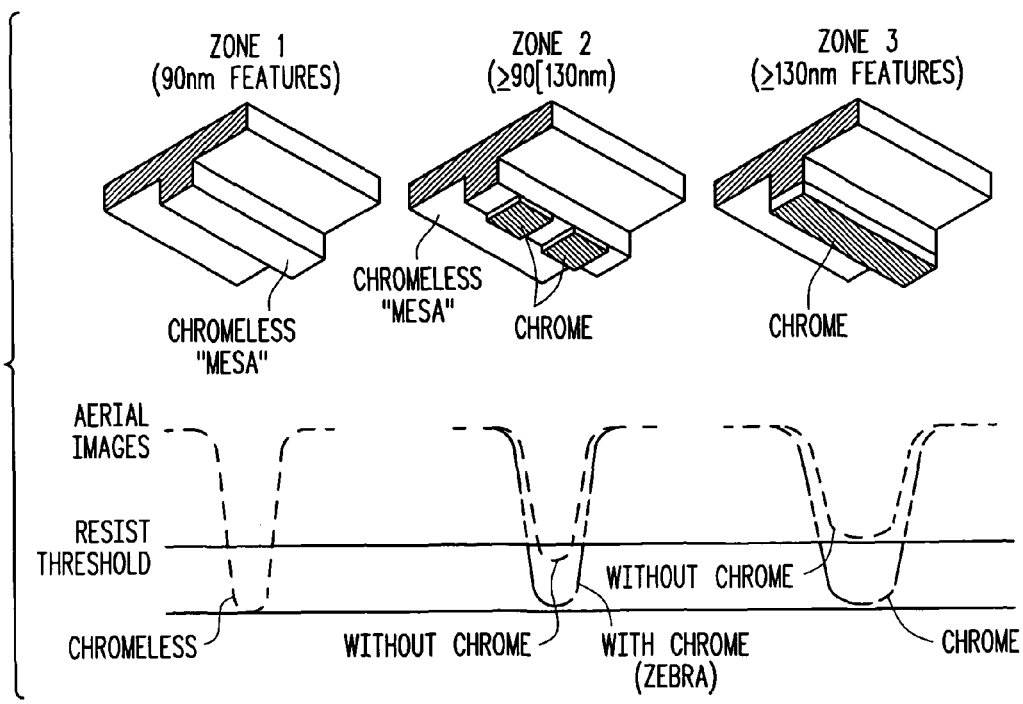
FIG. 2 is an illustration of a prior art 3-zone CPL process.

Next, the appropriate zones are defined as shown in step 303. The zones may be defined, for example, on the basis of the critical dimensions of the features to be printed. The definitions of the zones will vary depending on the given set of processing conditions and on the illumination conditions being utilized to image the wafer. Preferably, three zones will be defined (i.e., Zone 1, Zone 2\* and Zone 3), although embodiments may also be possible which involve a fewer or a greater number of zones. In this example, Zone 2\* is a collection of mask features having unitary chrome-capped etched quartz structures. The designation Zone 2\* is utilized to distinguish this zone from Zone 2 in the prior art process illustrated in FIG. 2, the latter of which is populated with zebra structures.

One possible method of defining the resultant zones is to run a simulation based on the desired conditions so as to determine the aerial image behavior and the mask error enhancement factor (MEEF) of the given process relative to feature width. Thereafter, the zones can be readily defined based, for example, on lithographic or mask-making requirements. Once the zones are defined, each of the features to be printed is assigned to a given zone in accordance with the zone definitions as shown in a step 305.

Next, a first mask pattern is generated as shown in step 307. The pattern contains each of the etched substrate components of the features contained in Zone 1 and Zone 2. A second mask pattern is generated, as shown in step 309, which contains each of the chrome components of the features contained in Zone 2\* and 3. Each feature assigned to Zone 1 is implemented in the mask as adjacent phase edges etched in a substrate, and each feature assigned to Zone 3 is implemented in the mask in chrome. Each feature assigned to Zone 2\* is implemented in the mask as chrome-capped phase features (i.e., adjacent phase edges etched in a substrate, with a unitary layer of chrome disposed on an upper surface of the portion of the substrate that remains between the adjacent phase edges).

As shown in step 311, the first mask pattern and the second mask pattern are then imaged in a single imaging step in order to form the desired image on the wafer. This may be accomplished through the use of conventional lithography equipment that is well known to the art.

Figure 6:
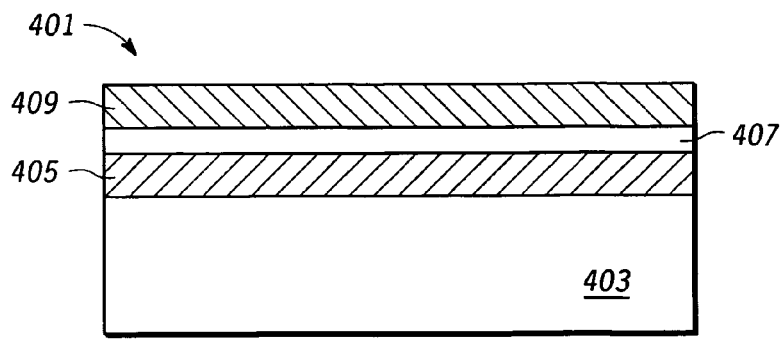
FIG. 6 is an illustration of one step in an embodiment of a method for fabricating a mask in accordance with the teachings herein.

FIGS. 6-12 illustrate one particular, non-limiting example of a mask fabrication process flow in accordance with the teachings herein. With reference to FIG. 6, a mask blank 401 is provided which comprises a substrate 403, a layer of metal 405, an antireflective layer 407, and a first layer of photoresist 409. The substrate 403 preferably comprises quartz, and the metal 405 preferably comprises chrome. The first layer of photoresist 409 preferably comprises a suitable e-beam lithography resist such as, for example, NEB22 (a negative tone resist available commercially from Sumitomo Corporation, Tokyo, Japan), or FEP171 (a positive tone resist available from Fujifilm Electronic Materials U.S.A. Inc., North Kingstown, R.I.).

Figure 7:
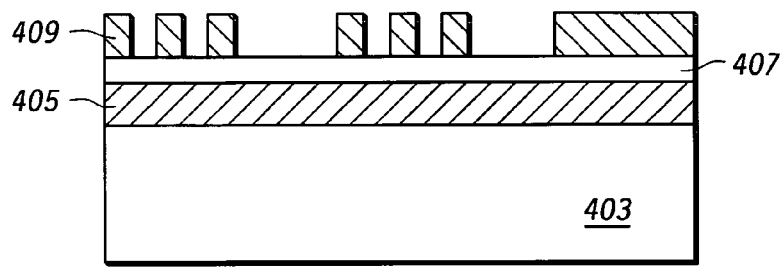
FIG. 7 is an illustration of one step in an embodiment of a method for fabricating a mask in accordance with the teachings herein.

Referring to FIG. 7, a first pattern is defined in the first layer of photoresist 409 using suitable lithographic techniques. The first pattern corresponds to the chromeless phase components of the Zone 1 features and the etched substrate components of Zone 2\* features as well as some Zone 3 components (see FIG. 12). This step, which is one of two writing steps employed in the method and which is used to define the primary mask features, may be accomplished, for example, through the use of suitable e-beam writing techniques as are known to the art. This step will typically include nominal registration of the first pattern with the edges of the mask.

Figure 8:
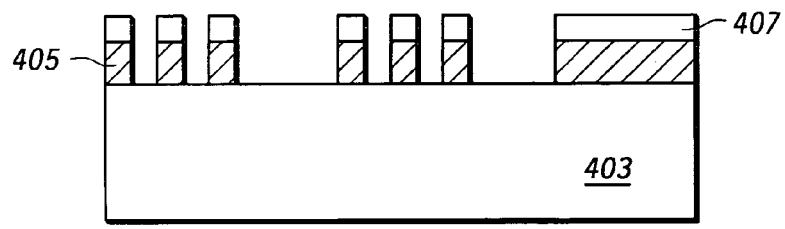
FIG. 8 is an illustration of one step in an embodiment of a method for fabricating a mask in accordance with the teachings herein.
Figure 9:
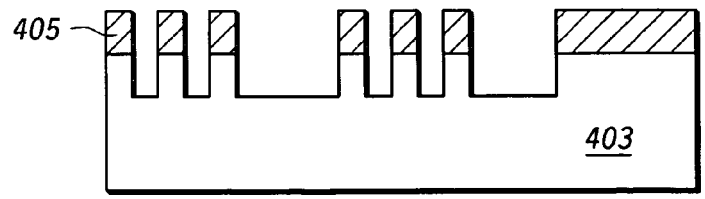
FIG. 9 is an illustration of one step in an embodiment of a method for fabricating a mask in accordance with the teachings herein.

Using the first layer of photoresist 409 as an etch mask, the antireflective layer 407 and the underlying metal layer 405 are subsequently etched down to the substrate 403 through the use of a suitable etchant as shown in FIG. 8, after which the first layer of photoresist is stripped. Then, as shown in FIG. 9, the quartz substrate 403 is etched by using the patterned metal layer 405 as an etch mask, and with the use of a suitable etchant that is selective to the metal layer which typically is chrome. This etch imparts a first pattern in the quartz substrate 403 which corresponds to the chromeless phase components of the Zone 1 features 415 and the etched substrate components of the Zone 2\* features 417 and Zone 3 features 419. The antireflective layer 407 is typically removed during the quartz substrate etch as shown in FIG. 9.

Figure 10:
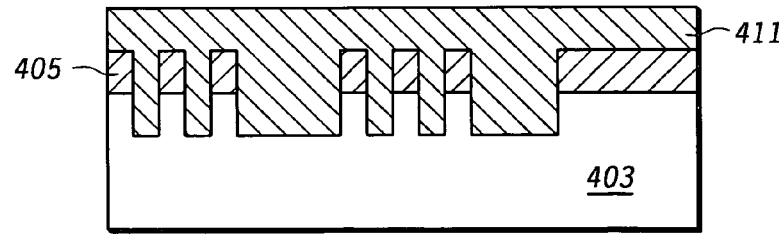
FIG. 10 is an illustration of one step in an embodiment of a method for fabricating a mask in accordance with the teachings herein.
Figure 11:
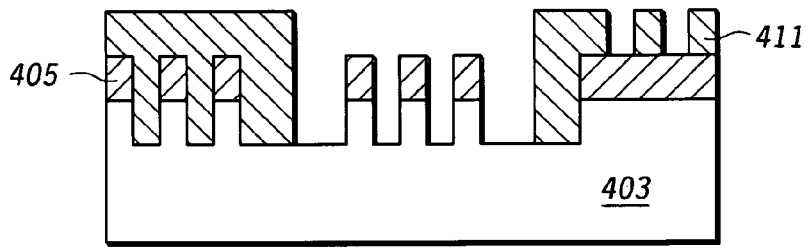
FIG. 11 is an illustration of one step in an embodiment of a method for fabricating a mask in accordance with the teachings herein.

With reference to FIG. 10, a second layer of photoresist 411 is then deposited over the structure. The second layer of photoresist 411 is preferably an optical resist upon which a second pattern is written through optical exposure. This step is the second of two writing steps employed in the method, and is used to define the secondary mask features. Typically, this second writing step will also require registration of the second pattern with the first pattern.

Figure 12:
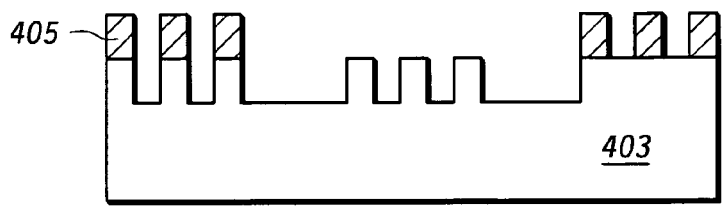
FIG. 12 is an illustration of one step in an embodiment of a method for fabricating a mask in accordance with the teachings herein.

The second layer of photoresist 411 is imparted with a pattern for the Zone 3 features 419 (see FIG. 12), and the portion of the second layer of photoresist 411 extending over the Zone 1 features 415 is removed. The pattern for the Zone 3 features is then imparted to the exposed portion of the metal layer 405 through etching, and the second layer of photoresist is stripped as shown in FIG. 12. The mask now has Zone 1 features 415, Zone 2\* features 417, and Zone 3 features 419 defined on it (in the particular embodiment depicted, the Zone 3 structures are pure chrome as well as chrome-capped mesas). After the mask is formed, it may be used to transfer the patterns written on it to a chip, wafer or other substrate, typically through the use of a reduction stepper.

Figure 13:
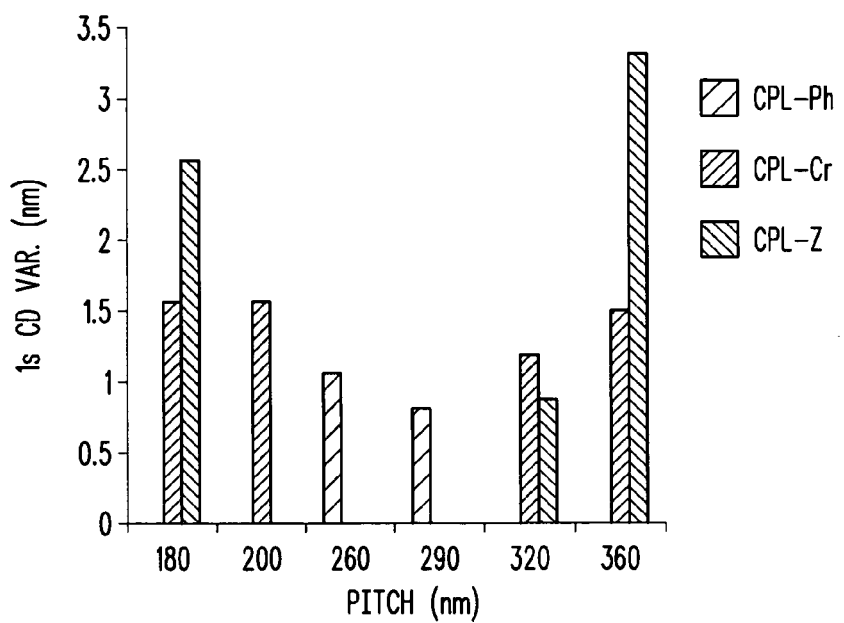
FIG. 13 is a graph of CD variance as a function of pitch.

The feasibility of the chrome-capped structures described herein for creating Zone 2\* features may be appreciated with respect to FIG. 13. The graph in FIG. 13 illustrates the CD variance (in nanometers) as a function of pitch for simulation testing of Zone 2\* features made using the type of chrome-capped CPL structures described herein (denoted CPL-Cr). For comparison, the CD variance of features made using the zebra process (denoted CPL-Z), and the CD variance of features made using CPL alone (denoted CPL-Ph), are also provided at various pitches. The simulation testing assumes a full resist model with an exposure tool having quadrapole illumination, and having a numerical aperture of 0.85, a normalized outer radius of 0.87, a normalized inner radius of 0.57, and a 30° opening or pole angle. The simulation also assumes that the process is centered on printing a 70 nm nominal line width with a 260 nm pitch. The variance in dose in the exposure tool (1σ) is assumed to be 1%, the variance in focus (1σ) of the tool is assumed to be 0.04 μm, and the variance in mask critical dimension (6σ, which is essentially the total range) is assumed to be 4 nm (at 1×). The pitch is the sum of line width and spacing (that is, the spacing between adjacent lines).

As the graph of FIG. 13 illustrates, the CD variability predicted for the three methods varies with pitch. As might be expected, the chromeless phase structures provide minimal CD variability at the target pitch (260 nm). Notably, however, at other pitches, the CD variability predicted for chrome-capped phase structures is either better than, or comparable to, the CD variability predicted for zebra structures, and is close to the CD variability predicted for the chromeless phase structures at the target pitch.

As previously noted, the unitary chrome-capped phase structures disclosed herein are significantly easier (and therefore less expensive) to manufacture than zebra structures. Hence, these results demonstrate that the chrome-capped phase structures disclosed herein are a viable alternative to zebra structures at many pitches. Indeed, these results demonstrate that the chrome-capped phase structures disclosed herein outperform zebra structures at some pitches, while at other pitches, the ease of use of these structures would likely outweigh any marginal improvement in CD variance provided by the zebra structures.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A method for imparting a pattern to a substrate, comprising:
providing a photolithographic mask adapted for use in imparting a pattern to a substrate, wherein the pattern comprises a plurality of features, and wherein at least one of the plurality of features is implemented in the mask as a phase shifting structure with a unitary layer of opaque material disposed thereon; and
utilizing the mask to impart the pattern to a substrate; wherein the photolithographic mask comprises a first set of mask features adapted to produce features having a critical dimension CD within the range of $0<k \leq CD < m$, where k and m are real number dimensions, wherein the first set of mask features includes a plurality of phase shifting structures, and wherein each of the phase shifting structures has a unitary layer of chrome disposed thereon which is co-continuous with the phase-shifting structures; and wherein the photolithographic mask further comprises a second set of mask features adapted to produce device features having a critical dimension $CD<k$, and a third set of mask features adapted to produce device features having a critical dimension $CD \geq m$.

2. The method of claim 1, wherein the substrate is a semiconductor substrate having a layer of photoresist disposed thereon, and wherein the pattern is imparted to the layer of photoresist.

3. The method of claim 1, wherein the second set of mask features includes chromeless phase shifting structures, and wherein the third set of mask features includes chrome structures.

4. The method of claim 1, wherein the phase shifting structure is a quartz mesa which is capped with a unitary layer of chrome.

5. The method of claim 1, wherein the mask comprises a substrate, and wherein the second set of mask features are phase shifting structures etched into the substrate.

6. The method of claim 1, wherein the third set of mask features are essentially opaque to electromagnetic radiation having a wavelength of 193 nm.

7. The method of claim 1, wherein the opaque material comprises chrome.

8. The method of claim 1, wherein 60 nm $\leq k \leq$ 120 nm and 100 nm $\leq m \leq$ 160 nm.

9. The method of claim 1, wherein 80 nm $\leq k \leq$ 100 nm and 120 nm $\leq m \leq$ 140 nm.

10. The method of claim 1, wherein the phase shifting structure comprises adjacent phase edges etched into a substrate.

11. The method of claim 10, wherein the phase shifting structure comprises a mesa, and wherein the unitary layer of opaque material is disposed on the upper surface of said mesa.

12. A method for imparting a pattern to a substrate, comprising:
providing a photolithographic mask adapted for use in imparting a pattern to a substrate, wherein the pattern comprises a plurality of features, and wherein the photolithographic mask comprises (a) a first set of mask features adapted to produce pattern features having a critical dimension CD within the range of $0<k \leq CD<m$, where k and m are real number dimensions, wherein the first set of mask features includes a plurality of phase shifting structures, and wherein each of the phase shifting structures has a unitary layer of opaque material disposed thereon which is co-continuous with the phase-shifting structures, (b) a second set of mask features adapted to produce pattern features having a critical dimension $CD<k$, and (c) a third set of mask features adapted to produce pattern features having a critical dimension $CD \geq m$ and
utilizing the mask to impart the pattern to a layer of photoresist disposed on a semiconductor substrate.

13. The method of claim 12, wherein the opaque material comprises chrome.

14. A photolithographic mask, comprising:
"(a) a first set of mask features adapted to produce device features having a critical dimension CD within the range of $0<k \leq CD<m$, where k and m are real number dimensions, wherein the first set of mask features includes a plurality of phase shifting structures, wherein each of said phase shifting structures has a unitary layer of chrome disposed thereon which is co-continuous with the phase-shifting structures, (b) a second set of mask features adapted to produce device features having a critical dimension $CD<k$; and a third set of mask features adapted to produce device features having a critical dimension $CD>m$, wherein the second set of mask features includes chromeless phase shifting structures, and wherein the third set of mask features includes chrome structures."

15. The photolithographic mask of claim 14, wherein the phase shifting structure is a quartz mesa which is capped with a unitary layer of chrome.

* * * * *